United States Patent
Huang et al.

(10) Patent No.: US 6,570,642 B2
(45) Date of Patent: May 27, 2003

(54) METHOD AND APPARATUS FOR PLACING IDENTIFYING MARK ON SEMICONDUCTOR WAFER

(75) Inventors: Yung-Sheng Huang, Hsin-Chu (TW); Hung-Chang Hsieh, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/920,605

(22) Filed: Aug. 2, 2001

(65) Prior Publication Data

US 2001/0048508 A1 Dec. 6, 2001

Related U.S. Application Data

(62) Division of application No. 09/349,842, filed on Jul. 8, 1999.

(51) Int. Cl.[7] .................. G03B 27/54; G03B 27/74; G03B 27/42; G03B 27/00
(52) U.S. Cl. .................. 355/67; 355/53; 355/68; 355/1
(58) Field of Search .................. 355/67, 53, 68, 355/70, 69, 1; 430/323, 313; 438/700, 401; 359/855, 224; 396/315

(56) References Cited

U.S. PATENT DOCUMENTS

| | | | | |
|---|---|---|---|---|
| 4,847,183 A | * | 7/1989 | Kruger | 430/296 |
| 5,109,153 A | * | 4/1992 | Johnsen et al. | 235/432 |
| 5,204,224 A | | 4/1993 | Suzuki | 430/315 |
| 5,288,998 A | | 2/1994 | Betzig et al. | 250/227.26 |
| 5,384,464 A | | 1/1995 | De Fornet et al. | 250/492.2 |

* cited by examiner

Primary Examiner—Russell Adams
Assistant Examiner—Peter B. Kim
(74) Attorney, Agent, or Firm—George O. Saile; Stephen B. Ackerman; William Robertson

(57) ABSTRACT

A tool for placing an identifying mark on a semiconductor wafer has a bundle of optical fibers that can be illuminated in a pattern representing an identifying character. Light from the fibers is focused on a photoresist layer during wafer manufacture and a pattern of dots is etched into the wafer to represent the character. The dots are too small to be seen with the human eye but the character can be read by a human or by a machine. The character is etched as part of a conventional etch step in manufacturing the wafer and it is easily repeated as a series of manufacturing steps obscure the original mark.

6 Claims, 2 Drawing Sheets

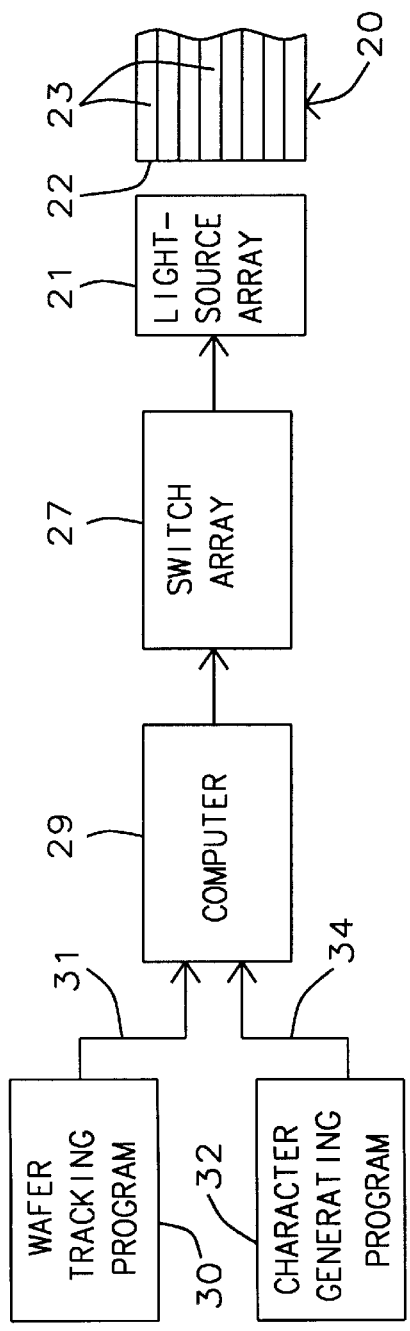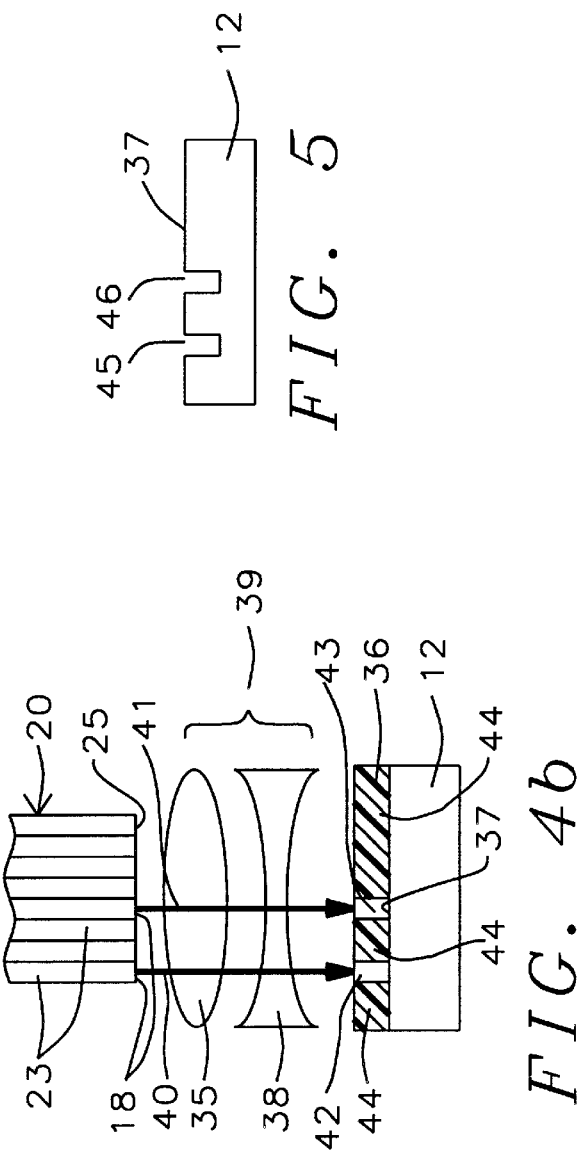

though the tool can form other marks as well. The tool can form a mark that is too small to be read without magnification, or it can form a pattern that is read by a machine but that is not a conventional character.

METHOD AND APPARATUS FOR PLACING IDENTIFYING MARK ON SEMICONDUCTOR WAFER

This is a division of patent application Ser. No. 09/349,842, filing date Jul. 8, 1999, Method And Apparatus For Placing Identifying Mark On Semiconductor Wafer, assigned to the same assignee as the present invention.

FIELD OF THE INVENTION

This invention relates generally to a process for manufacturing a semiconductor wafer, and more specifically it relates to a method and apparatus for placing a mark on a wafer to identify it during the manufacturing process.

INTRODUCTION

In the manufacture of semiconductor chips, a wafer of silicon or other semiconductor material is processed to form the individual chips. In a process step that is relevant to this invention, a layer of photoresist is spread over the surface of the wafer and is exposed and developed to produce a pattern of openings in the resist layer. The openings expose the underlying structure for the next process step and the resist areas that remain after developing isolate the structure during this step. Commonly, the resist forms a mask for etching the wafer.

Individual wafers are identified during manufacture. For example, several wafers can be identified by a common lot identifier (the lot ID) and wafers in the same lot can be given individual identifiers (the wafer ID). A wafer carries an identifying mark that typically is made up of the lot ID and a wafer ID. The identifier is commonly generated by a computer program. A typical wafer identifying mark has 11 characters and is about 13 millimeters in length.

An object of this invention is to provide a new an improved tool for producing this identifying mark.

THE PRIOR ART

In one technique of the prior art for forming a wafer identifying mark, a mark is etched into the silicon with a laser. Unfortunately, the laser may produce bumps of silicon that can cause micro scratches on the wafer after the wafer has gone the CMP process step (chemical and mechanical polishing).

SUMMARY OF THE INVENTION

The wafer marking tool of this invention uses a fiber optic bundle and an associated optical system to illuminate a photoresist in a pattern for an identifying character. Preferably, a switch able light source is provided for each fiber. These light sources are selectively switched on or off to form a pattern for a character. (In the specific description later, the letter "T" is used as an example.)

A layer of a resist is formed on the wafer and is exposed to the light pattern created by the marking tool. The resist is then developed and the wafer is etched in the pattern of the resist to form an arrangement of small holes that trace the character. The holes are about 100 microns in diameter and about 1 micron deep. The individual dots are too small to be seen, but the character is large enough to be read by operating personnel and by conventional machines for this purpose.

The character will ordinarily be etched during an etching step that is performed for wafer manufacture, and etching the character does not interfere with a simultaneous etch that takes place for manufacturing the wafer. The wafer resist is exposed separately for the identifying mark because the mark is unique to a single wafer.

During wafer manufacturing, a wafer etching step is commonly performed several times as a multi-layered structure is formed on the silicon substrate, and the wafer identifier mark becomes obscured by these process steps. Depositing metal on the wafer particularly obscures the mark. The etch step can be repeated without affecting the other steps of the manufacturing process.

Other objects and features of the invention will appear in the description of a preferred embodiment of the invention.

THE DRAWING

FIG. 4 is a diagram of the wafer identifying tool of this invention and a section view of a wafer illustrating one step in the method for marking the wafer with the tool.

FIG. 5 is a section view of a wafer and shows the next step in the method for marking the wafer.

THE PREFERRED EMBODIMENT

Figure 1:
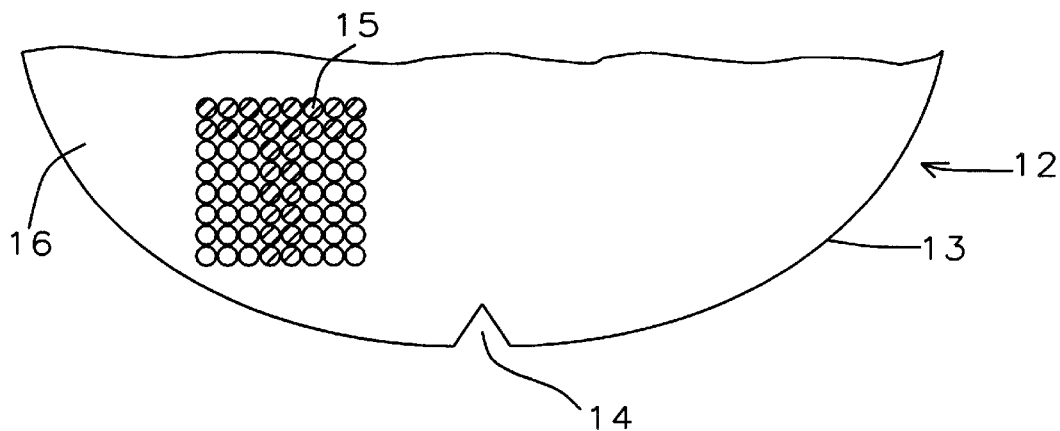
FIG. 1 is a top view of part of a wafer and shows an example of an identifying character etched on the wafer surface.

The Wafer Identifier—FIG. 1

FIG. 1 shows part of a wafer 12 that is conventionally circular except for a notch 14 in its edge 13. Notch 14 is a mark for orienting the wafer. Commonly, a wafer identifying character 15 is located near the notch, and the drawing shows the single letter, "T" formed in this region. From a more general standpoint, a set of one or more identifying characters 15 is formed in a suitable region 16 of wafer 12 and this region may be associated with a wafer orienting mark 14.

Figure 2:
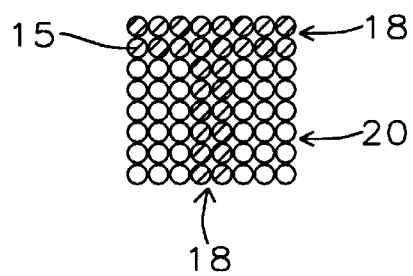
FIG. 2 is a diagram showing the character of FIG. 1 formed by a matrix of fibers in a fiber optic bundle.

The Optical Fiber Character Matrix—FIG. 2

FIG. 2 shows the "T" of FIG. 1 as part of a matrix of circles that represent the light emitting ends of optical fibers. The darkened circles that form the letter "T" represent fibers that are carrying light and the clear circles form the background of the character T and represent the positions of fibers that are not carrying light in this example. In this example, the resist is removed where it has been exposed to light carried by the fibers. Similarly, the light sources can be controlled to form the complement of the pattern of FIG. 1 if the resist is removed in the regions that are not exposed to light.

Bundle 20 is in the form of an eight by eight orthogonal array of optical fibers. The art of forming characters with such an array is well known from the familiar use of dot arrays for characters on a computer display and in some printers. Any suitable array can be used.

As character 15 is represented in FIGS. 1 and 2, the vertical stem and the horizontal cap of the T are each formed by a double row of dots 18.

From a more general standpoint, the outline of the letter is filled with dots. The dots represent circular holes formed in the wafer, but the term "dots" is used here in this description because this terminology will be familiar from other dot matrix characters such as a computer display and a dot matrix printer.

The letter "T" in this example is a human readable character but from a more general standpoint it is part of the character set that is customarily used for identifying wafers. The letter T is representative of a variety of characters, such as letters and numerals, that are human readable. Other symbols such as a bar code can be formed by the process that will be described later. Ordinarily the wafer identifier will be formed as a block of several characters in order to track a large number of wafers.

Figure 3:
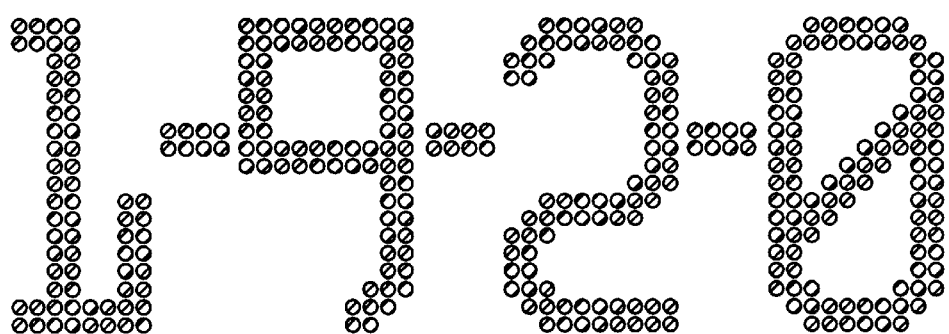
FIG. 3 is a diagram similar to FIG. 2 but illustrating a preferred character font.

As is common for a dot matrix printer, the dots are arranged in an orthogonal array. The letter "T" is eight dots high and eight dots wide. The array can be any suitable size, as will be understood from the use of character forming arrays for fonts for various devices such as printers and displays. A preferred matrix is 10 characters wide and 18 characters high. FIG. 3 shows several dot matrix characters in this format.

The Wafer Identifier Marking Tool—FIG. 4

The wafer marking tool includes a fiber bundle 20 and a light source array 21. The light sources are conventional and are represented collectively by a functional block. The light receiving ends 22 of the fibers 23 in bundle 20 are positioned for each fiber 23 to be illuminated by an associated light source. Light from array 21 will be used to expose a photoresist, and the light sources are chosen to produce the appropriate wave length, as will be readily understood.

FIG. 4 shows the light emitting ends 25 of eight fibers 23 of one side of the eight by eight array that forms the character T in FIGS. 1 and 2. In FIG. 4, the light sources 21 and the light receiving ends 22 of the fibers 23 are organized in the same array as the light emitting ends and the lights are correspondingly arrayed. However, the light array and the light receiving ends of the fibers can be organized in any other suitable configuration in which each light source is coupled to the corresponding one of the fibers.

A switch array 27, represented collectively in FIG. 2 by a functional block, is connected to selectively switch on or off each of the light sources individually. Suitable switches are well known in various technologies, but it will be convenient to suppose that each switch is a field effect transistor that turns on and off in response to a signal at its gate terminal.

In concept, light switches 27 could be turned on or off by hand to set up a selected pattern for the fiber array, but preferably the switches are controlled by a computer 29.

Conventionally, computer 29 has a program 30 for processing data associated with the wafer manufacturing process, and it generates the multi-byte wafer identifying codes and tracks the wafers during manufacturing. A line 31 interconnecting computer 29 and program 30 represents the hardware connection and the supporting programs for accessing program 30 in the computer memory by a central processing unit (part of the computer and not shown separately). Computer 29 and program 31 are conventional and are shown in FIG. 4 by functional blocks.

A program 32 uses the multi-byte wafer identifying code to form the pattern for turning switches 27 on or off. Line 34 represents the interconnection of computer 29 and program 32. Program 32 may have a table holding the switch configurations for each character and such a table can be accessed by supplying the code that is to be translated. Generating the character pattern will be familiar from the analogous use of codes for printers and displays and will be understood without further description.

As FIG. 4 shows, wafer 12, introduced in the description of FIG. 1, has a photoresist layer 36 formed on its upper surface 37. An optical system 39 in FIG. 4 focuses an image of the light emitting ends 25 of the fibers onto photoresist layer 36. A housing holds the light emitting end of the fiber bundle and the associated optical system 39 in the relative position shown in FIG. 4. Suitable housings are well known and are not shown in the drawing. A suitable fixture positions the tool with respect to the wafer, as FIG. 4 shows. These fixtures are well known and are not shown in FIG. 4.

Arrows 40, 41 in FIG. 4 represent the path of light through optical system 39, and regions 42, 43 represent places in the photoresist layer where the resist is exposed to the light. A fiber 23 is larger in diameter than the preferred size for the corresponding dot 18 and the optical system forms a reduced image on the resist layer 36.

The preferred optical system is shown in FIG. 4 has a convex lens 37 and a concave lens 38 which produce the optical effect that has been described. Commercially available lenses will be specified by their intended function.

Forming Dots 18 on the Wafer

The dots 18 are larger than many features created using photoresist, and they can be formed as part of a conventional etch process that is performed primarily for producing devices on the wafer and only secondarily used for producing the wafer identifying characters. Ordinarily, other regions of the resist, not represented in the drawing, will be exposed according to a desired pattern that is independent of dots 18.

Exposed regions 42, 43 of the photoresist layer 36 are removed when the photoresist is developed, and remaining regions 44 of layer 36 mask the underlying regions of the wafer. The wafer surface is etched in any suitable way, as established for the accompanying step of the wafer manufacturing process. FIG. 5 shows the wafer 12 of FIG. 4 after the etch step. Holes 45 and 46 form two of the dots of the characters illustrated in FIGS. 1, 2 and 3.

A dot 45, 46 is about 100 microns in diameter and about 1 micron deep. Thus, a dot is too small to be resolved by the human eye. A character (15 in FIG. 1) is preferably of a size to be human readable and the characters are readable by machines constructed for this purpose. A typical wafer mark has about 13 characters and is about 13 millimeters in length.

The tool of FIG. 4 exposes the resist for a single character at a time, but it illustrates all of the features of a tool for producing the entire character block with one exposure.

SUMMARY

From the description of a preferred embodiment of our invention, those skilled in the art will recognize different implementations of components that are by themselves conventional and other variations within the spirit of the invention and the scope of the claims.

What is claimed is:

1. A tool for marking a semiconductor wafer with a block of characters identifying the wafer, comprising, a fiber bundle, each fiber in the bundle having a light receiving end and a light emitting end, the fibers being organized in a matrix with which a selected character can be formed at the light emitting ends by illuminating selected ones of the fibers at the light receiving ends, and means for selectively illuminating the fibers at their light receiving ends with a wavelength to which a predetermined photoresist is responsive and in a pattern to form said selected character at the light emitting ends of the fibers, said means for illuminating the fibers including an optical system for focusing the light from the ends of the fibers onto a region of the photoresist that is smaller than the area of the light emitting end of the fiber bundle, whereby a photoresist of a semiconductor wafer can be exposed to light from the fibers for etching the identifying character into the wafer as a pattern of dots, each dot being formed by an individual fiber.

2. The wafer marking tool of claim 1 wherein the optical system creates dots that are smaller than can be seen with the human eye.

3. The wafer marking tool of claim 2 wherein the number of fibers is large enough that a character can be identified with the human eye although an individual dot can not be seen with the human eye.

4. The wafer marking tool of claim 1 wherein the means for selectively illuminating the fibers at their light receiving ends comprises a light source for each fiber and a switch for each light source for illuminating selected fibers.

5. The wafer marking tool of claim 4 including a computer having programming means for creating a code for identifying the wafer and programming means for controlling the switches to create a character pattern at the light receiving ends of the fibers.

6. A tool for marking a semiconductor wafer with a block of characters identifying the wafer, comprising, a fiber bundle, each fiber in the bundle having a light receiving end and a light emitting end, the fibers being organized in a matrix with which a selected character can be formed at the light emitting ends by illuminating selected ones of the fibers at the light receiving ends, and means for selectively illuminating the fibers at their light receiving ends with a wavelength to which a predetermined photoresist is responsive and in a pattern to form said selected character at the light emitting ends of the fibers, said means for selectively illuminating the fibers including optical means for focusing the light representing a character at the light emitting ends of the fibers on a layer of a photo resist formed on a semiconductor wafer to permit etching the character in the semiconductor wafer underlying the photo resist layer, whereby a photoresist of a semiconductor wafer can be exposed to light from the fibers for etching the identifying character into the wafer as a pattern of dots.

* * * * *